US005512705A

United States Patent [19]

Kobayashi

[11] Patent Number: 5,512,705

[45] Date of Patent: Apr. 30, 1996

[54] MUSICAL TONE SYNTHESIZING APPARATUS

[75] Inventor: Kaoru Kobayashi, Hamamatsu, Japan

[73] Assignee: Yamaha Corporation, Japan

[21] Appl. No.: 625,374

[22] Filed: Dec. 11, 1990

[30] Foreign Application Priority Data

Dec. 12, 1989 [JP] Japan .................................. 1-322249

[51] Int. Cl.[6] .................................................. H03G 3/00

[52] U.S. Cl. ................................. 84/622; 84/624; 84/625

[58] Field of Search ............................ 84/622, 624, 625, 84/644, 659–661, 670, 692, 694–700, DIG. 10, DIG. 26

[56] References Cited

U.S. PATENT DOCUMENTS

| | | | |
|---|---|---|---|
| 4,130,043 | 12/1978 | Niimi | 84/DIG. 10 |
| 4,584,701 | 4/1986 | Nakama et al. | 381/63 |
| 4,674,386 | 6/1987 | Conklin, Jr. | 84/216 |
| 4,893,538 | 1/1990 | Masaki et al. | 84/605 |
| 4,984,276 | 1/1991 | Smith | 84/630 X |

FOREIGN PATENT DOCUMENTS

| | | |
|---|---|---|
| 52-30417 | 3/1977 | Japan . |
| 63-40199 | 2/1988 | Japan . |
| 3174593 | 7/1991 | Japan . |

OTHER PUBLICATIONS

Garnett, Guy E. "Modeling Piano Sound using Waveguide Digital Filtering Techniques", 1987 ICMC Proceedings, pp. 89–95.

Nakamura, Isao and Yamaguchi, Junichiro, "Synthesis of Piano Tone By Means of Computer Simulation–Digital Filter Method". . . , Thesis of Japanese Acoustic Society Lectures, p. 515, Apr., 1977.

Nakamura, Isao, "The character of piano tones—Acoustical research on the piano (Part 4), Journal of Japanese Acoustic Society", vol. 38, No. 8, p. 454, 1982.

*Primary Examiner*—Brian Sircus
*Attorney, Agent, or Firm*—Graham & James

[57] ABSTRACT

A musical tone synthesizing apparatus generates musical tones of acoustic musical instrument which has operator like a hammer, and a vibrating element such as a string or a vibrating plate. The apparatus has a loop circuit which comprises at least two delays of which total delay time of the two delays corresponds to pitch of a musical tone, a propagating circle for simulating the vibrating element, an exciting signal generator which generates signal in accordance with a non-linear relation between the operator and the vibrating element, and a delay controller which controls a ratio of the delay time between the two delays. By varying the ratio, the apparatus realizes the characteristics of the vibration in the vibrating elements of which struck positions by the operator change in accordance with pitch of tones to thereby generates musical tones with fidelity.

11 Claims, 5 Drawing Sheets

MUSICAL TONE SYNTHESIZING APPARATUS

BACKGROUND OF THE INVENTION

1. Field of the Invention

This invention relates to a musical tone synthesizing apparatus used for the synthesis of the musical tones of a plucked-string or struck-string musical instrument or the like.

2. Prior Art

A first type of prior art known is an apparatus which synthesizes the tones of an acoustic musical instrument by means of simulating the tone generation mechanism of an acoustic musical instrument. For example, a construction in which a low pass filter which simulates the reverberation loss of a string and a delay circuit which simulates the propagation delay of the vibration of the string are connected in a closed loop is known. In this type of construction, when an excitation signal such as an impulse or the like is introduced into the closed loop, this excitation signal circulates around the closed loop. In this case, the excitation signal travels once around the closed loop in an amount of time equal to the vibrational cycle of the string, and the frequency band is restricted when the signal passes the low pass filter. Then the signal circulating around the closed loop is extracted and used as a musical tone signal of a stringed instrument.

According to this type of musical tone synthesizing apparatus, by varying the delay period of the delay circuit and the frequency characteristics of the low pass filter, musical tones can be synthesized which are close to those of acoustic stringed instruments which have different tone colors, such as plucked-string instruments (for example, guitars) and struck-string instruments (for example pianos). This type of technique is disclosed In, for example, Japanese Patent Application, Laid-open Number Sho. 63-40199, and U.S. Pat. No. 4,130,043.

In, for example, acoustic musical instruments such as pianos, by means of a hammer striking a string, the string is caused to vibrate at a fixed frequency and a musical tone is generated. In this case, a string and a hammer is provided for each of a plurality of keys. Accordingly, in this type of acoustic musical instrument, there are differences in the position at which the string is struck for each key, and there are slight differences between generated tone colors as a result of difference in striking position. However, in the musical tone synthesizing apparatus introduced above as the first type of prior art, because no account is taken of the corresponding relationship between the delay period in the delay circuit of the closed loop circuit and the key codes corresponding to each key, there is a problem in that it is impossible to cause each key code (each key) to slightly differ in tone color.

In contrast, a second type of prior art known is a musical tone synthesizing apparatus which uses a waveform memory. In this apparatus, a plurality of musical tone data having differing waveform characteristics are stored in advance in a waveform memory; this plurality of musical tone data is synthesized in correspondence with control parameters for changing tone color, Interpolation calculations are carried out between each musical tone data, and musical tones with complex tone colors are thus synthesized.

In this second type of musical tone synthesizing apparatus, complex tone color control can be realized, but as the parameters which cause the differences in tone color in acoustic musical instruments are all mixed, it is impossible to separately control solely the differences in tone color caused by differences in the striking position on the string as discussed above. As a result, in this type of musical tone synthesizing apparatus, there is a problem in that it is impossible to cause slight differences in tone color for each key code (each key).

SUMMARY OF THE INVENTION

Accordingly, it is a purpose of the present invention, in view of the problems discussed above, to provide a musical tone synthesizing apparatus which can reproduce with fidelity the slight differences in tone color generated as a result of differences in the striking position on the strings which are found in an acoustic musical instrument.

Accordingly, the present invention provides a musical tone synthesizing apparatus which synthesizes the musical tones of an acoustic musical instrument comprising a tone-generation body and a tone-generation manually operable member which excites a part of the said tone-generation body and thus causes the generation of reciprocally propagating vibrations; the musical tone synthesizing apparatus of the present invention is provided with a closed-loop circuit, which comprises at least two delay means each having variable delay time, sum of the delay times corresponding to a period of said reciprocally propagating vibration to circulate in the tone-generation body discussed above;

excitation means, which generates, responsive to operational data of the tone-generation manually operated member, an excitation signal corresponding to the excitation vibration imparted to the tone-generation body, and supplies this excitation signal to the delay means discussed above within the closed-loop circuit;

delay period memory means, which stores the delay period, indicative of said sum of said delay time, of the delay means in correspondence with the pitch data of the operational data discussed above; and delay time ratio memory means for storing the delay ratio of said delay times, dividing the delay periods by delay ratio, and supplying them to each delay means. other words, first, a delay period is read out from the delay period memory mechanism to the closed-loop circuit according to the pitch data of the performance data, next, the delay period is divided into the delay times by delay ratio in correspondence with the pitch data by the delay period ratio memory means, and the delay times are supplied to each delay means. Then, fixed delay periods are established in each delay means. Next, the excitation mechanism is generated, in accordance with the operational data of the tone-generation manually operated members, an excitation signal corresponding to the excitation vibration imparted to the tone-generation body and supplies this excitation signal to the input terminals of each delay mechanism within the closed-loop circuit. The excitation signal circulates in the closed-loop circuit, which is comprised of delay mechanisms having fixed delay ratios.

As a result, according to the construction of the present application, it is possible to reproduce with fidelity the differences in tone color caused by differences in the striking position of the strings in an acoustic musical instrument.

DETAILED DESCRIPTION OF THE PREFERRED EMBODIMENT

Figure 1:
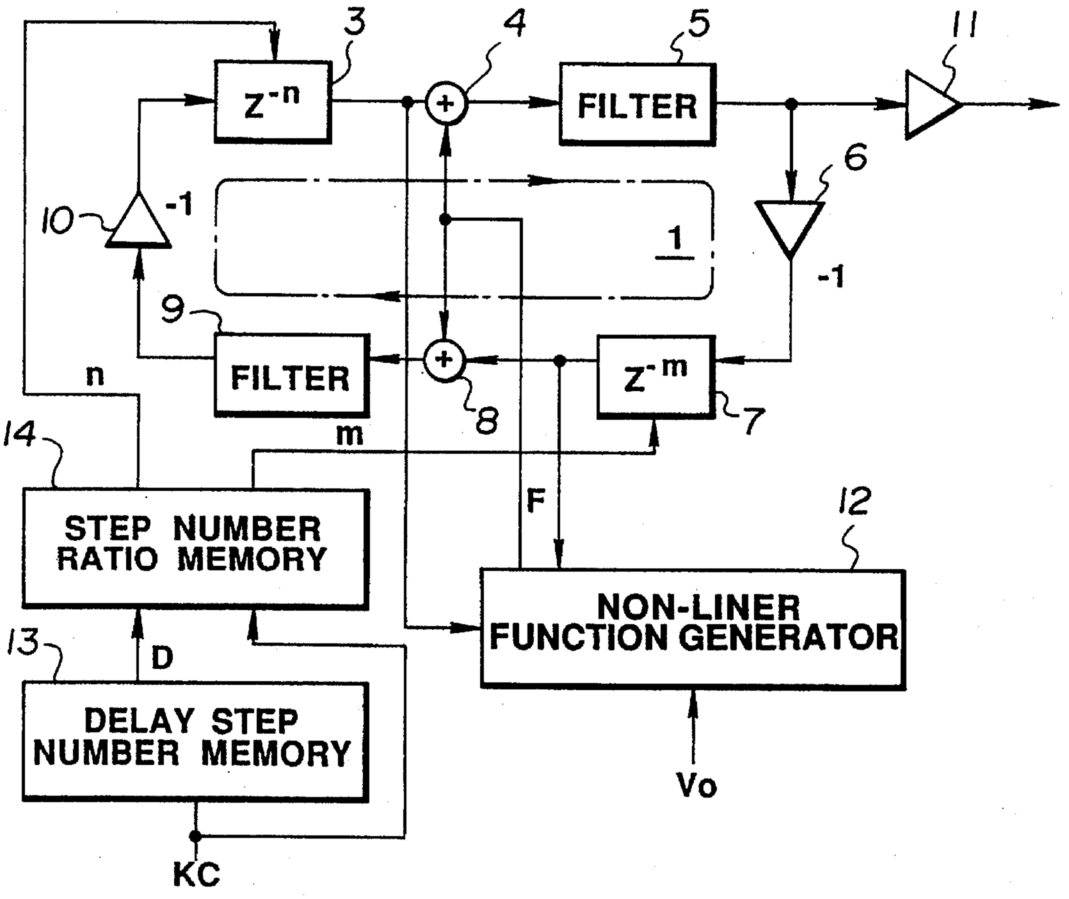
FIG. 1 is a block diagram showing the construction of a preferred embodiment of the present invention.

FIG. 1 is a block diagram showing the construction of a preferred embodiment of the present invention. In this musical tone synthesizing apparatus, musical tones generated by struck-string instruments such as pianos and the like are synthesized. In the diagram, reference numeral 1 refers to a closed-loop circuit which comprises delay circuit 3, adder 4, filter 5, phase inversion circuit 6, delay circuit 7, adder 8, filter 9, and phase-inversion circuit 10. This closed-loop circuit 1 simulates the vibration of a piano string.

Figure 2:
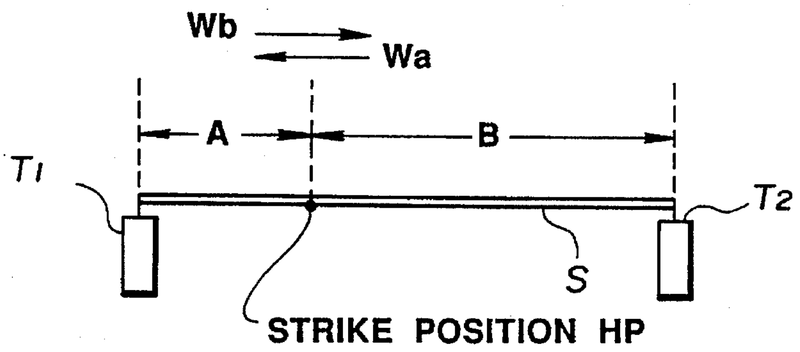
FIG. 2 is for the purpose of explaining the introduction mechanism of the excitation vibration to a string of a piano.

Here, the details of the construction given above will be explained with regard to the excitation mechanism of a piano which is shown in FIG. 2. First, In FIG. 2, reference S is a piano string, and reference HP is a striking position. Furthermore, both ends of string S are fixed, at fixed ends T1 and T2. In this type of piano, when a key is depressed on the keyboard, the string S corresponding to this key is struck by the hammer. The vibrational waves Wa and Wb are generated by the striking of the hammer and then propagated from the striking position HP to both fixed ends T1 and T2 when the waves reach at fixed ends T1 and T2, they reflect and propagated toward the opposite fixed end. In this way, the vibrational waves Wa and Wb are propagated between fixed ends T1 and T2 until the vibration thereof decreases and finally stops. In an actual struck-string instrument, a string S and a hammer such as those discussed above are provided for each key (which has different tone pitches) on the keyboard. Accordingly, it is difficult to arrange all the striking positions HP of the strings the same, and as a result, the ratio of the lengths of the string parts A and B vary in every string. Different ratios of the lengths cause that the delay periods of the string parts A and B differ; the closed-loop circuit 1 shown in FIG. 1 simulates these sorts of strings S. That is to say, in delay circuits 3 and 7, the period in which vibrational wave Wa is reflected at fixed end T1 and returns to the striking point, and the period in which vibrational wave Wb is reflected at fixed end T2 and returns to the striking point, are established as delay periods in correspondence with key codes KC (pitch data). Furthermore, inversion circuits 6 and 10 correspond to fixed ends T1 and T2 in FIG. 2; by means of these circuits, the phenomenon of the phase-inversion of vibrational waves Wa and Wb at fixed ends T1 and T2 is simulated. By proceeding in this manner, the period in which the excitation signal corresponding to the excitation vibration travels once around closed-loop circuit 1 becomes equal to the vibrational period of the standing wave of string S. Furthermore, filters 5 and 9 simulate the frequency characteristics of the decrease in vibration of string S. That is to say, by providing these filters 5 and 9, the phenomenon in which the higher harmonic components decrease more rapidly is simulated with fidelity. Next, adders 4 and 8 add a reverse-force signal F discussed hereinbelow to the excitation signal circulating around closed-loop 1. Furthermore, the excitation signal propagating in closed-loop circuit 1 is amplified by amplifier 11 and used as a musical tone signal with a pitch corresponding to the length of string S.

Furthermore, in FIG. 1, a construction of a musical tone synthesizing apparatus is shown which is realized by the use of digital circuits; if for example delay circuits 3 and 7 comprise shift registers, each steps of these shift registers comprise flip flops corresponding to the number of bits in a transmitted digital signal. A sample clock is provided for each fixed period for the flip flops of each step. Furthermore, the n and m in delay circuits 3 and 7 show the number of steps of the register. Accordingly, the delay periods of delay circuits 3 and 7 are established according to the number of steps of the flip flops in the case of this example. In addition, other elements of construction are realized, as delay circuits 3 and 7, by means of digital circuits.

Figure 3:
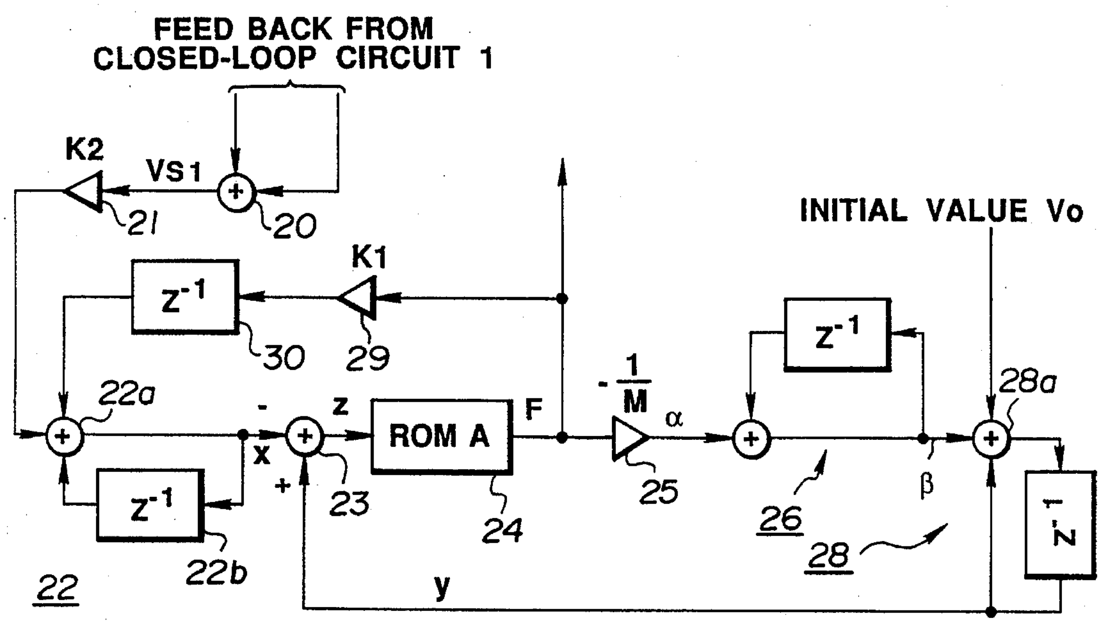
FIG. 3 is a block diagram showing the construction of an example of a non-linear function generation mechanism.

Furthermore, non-linear function generator 12 simulates the reverse force in the string S which tends to push back the hammer when the string S in FIG. 2 is struck. That is to say, this non-linear function generator 12 generates a time variant reverse force based on the excitation signals corresponding to the vibrational waves Wa and Wb, and on the initial value V0 corresponding to the initial velocity of the hammer, and then the generator outputs this result to the adders 4 and 8 as reverse force signal F (digital data). Here, an example of this non-linear function generator 12 is shown in FIG. 3. In the diagram, non-linear function generator 12 comprises adder 20, multiplier 21, integrator 22, subtracter 23, ROM 24, multiplier 25, integrator 26, integrator 28, multiplier 29 and one sample period delay circuit 30. Both excitation signals discussed above are added by adder 20 and outputted as velocity signal Vs1 corresponding to the vibrational velocity in the string S. This velocity signal Vs1 is multiplied by coefficient K2 in multiplier 21.

Figure 9:
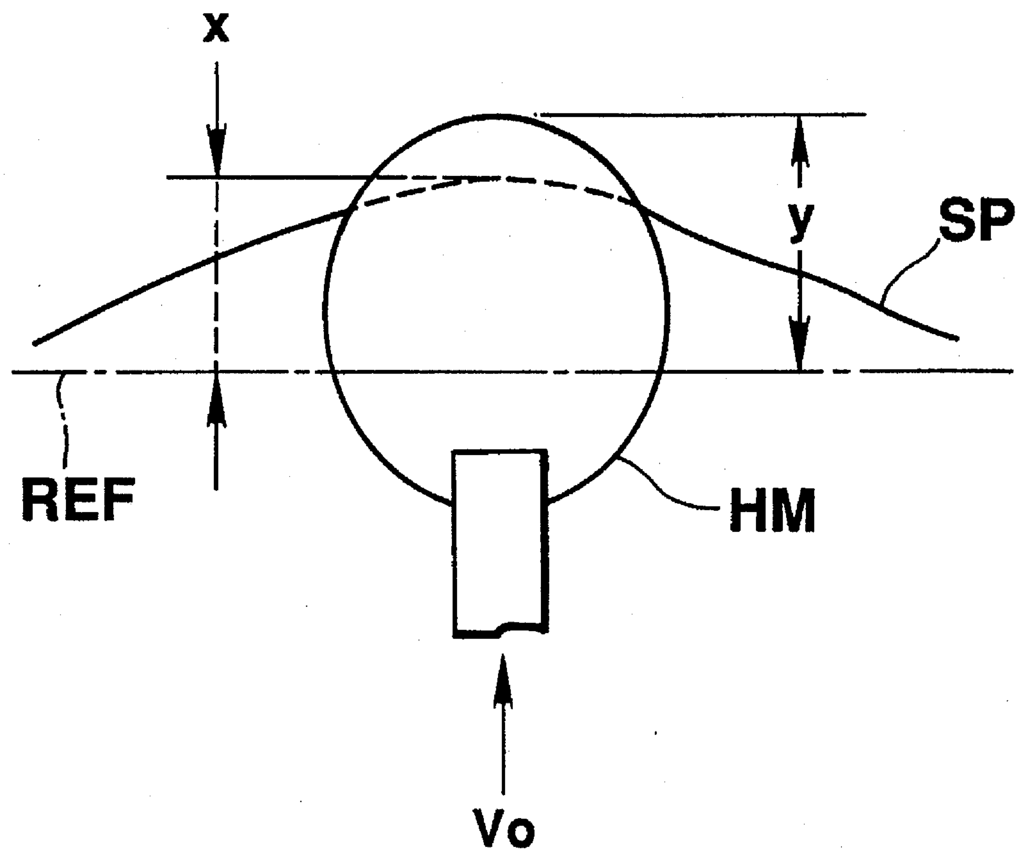
FIG. 9 is a simulation model for the purpose of explaining the point at which hammer HM strikes piano string SP.

Next, the output signal of multiplier 21 is supplied to integrator 22, comprising adder 22a and one sample period delay circuit 22*b*. A reverse force signal F corresponding to the reverse force operating on the hammer is supplied to this adder 22*a* through the medium of multiplier 29 and one sample period delay circuit 30. The output signal of multiplier 21 and reverse force signal F are integrated by integrating circuit 22. The result of this integration is string displacement signal x corresponding to the displacement of string S, which has been struck by the hammer, from its rest position; this string displacement signal x is supplied to one input terminal of subtracter 23 as shown In FIG. 9. hammer displacement signal y corresponding to the displacement (amount of movement) of the hammer from the rest position of string S is outputted from integrator 28 described hereinbelow and supplied to the other input terminal of subtracter 23. This subtracter 23 calculates a difference signal z (hammer displacement signal y–string displacement signal x) corresponding to the difference value (relative displacement Z) of the displacement of the string and the displacement of the hammer, and outputs this signal to ROM 24. Here, when the hammer is deforming string S, the difference signal z is positive, and a reverse force in proportion to the relative displacement Z (amount of deformation) is in operation between string S and the hammer (reverse force signal F assumes a fixed value). On the other hand, In the case where the hammer is only making light contact with string S, or in the case where there is no contact between the two, difference signal z is 0 or negative, and accordingly, the reverse force (reverse force signal F) is 0.

Figure 4:
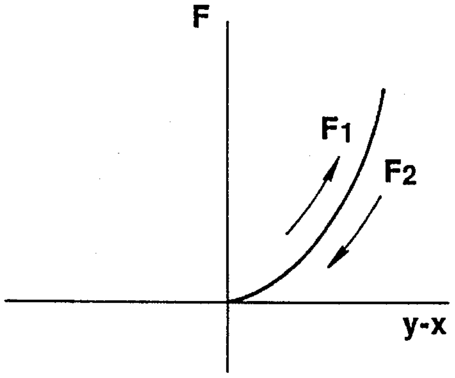
FIG. 4 explains a non-linear function A outputted by the same non-linear function generation mechanism.

A table of the non-linear function A which shows the relationship between the relative displacement of string S and the hammer and the reverse force F in operation between string S and the hammer is stored in the ROM 24 discussed above. FIG. 4 shows an example of a non-linear function A in the case where the hammer is made of soft materials such as felt or the like. As shown in the same diagram, in the case where relative displacement Z is 0 or negative, that is to say, where the hammer is not in a state of striking the string S, the relative force F is zero, as explained above, and when the hammer strikes string S, as the relative displacement Z becomes larger, reverse force F slowly becomes larger. In the case in which the hammer is made of hard materials, a non-linear function A is established according to which the reverse force F climbs steeply with respect to a change in the relative displacement Z.

In this manner, ROM 24 outputs the reverse force signal F corresponding to the reverse force F, which is in proportion to the relative displacement Z at a selected moment, to multiplier 25 and adders 4 and 8 of closed-loop circuit 1.

Next, multiplier 25 multiplies the reverse force signal F by a multiplication coefficient of −1/M. Here, M is a coefficient corresponding to the inertia of the mass of the hammer, and multiplier 25 outputs an acceleration signal α, corresponding to the acceleration of the hammer, to integrator 26. Integrator 26 comprises, like integrator 22 discussed above, an adder and a one sample period delay circuit; it integrates the acceleration signal α and outputs it as signal β, corresponding to the component of the change in velocity of the hammer, to adder **28*a* of integrator 28. Initial value V0 is supplied to this adder 28*a*; integrator 28 integrates the result of the addition of initial value V0 and signal α, and outputs this, as displacement signal y corresponding to the displacement of the hammer, to subtracter 23** discussed above.

Next, the explanation of FIG. 1 will be returned to. Reference numeral 13 is a delay step number memory, in which a delay period of delay circuits 3 and 7 of closed loop circuit 1, which corresponds to a key code KC outputted by a manually operable member (key) not shown in the diagram, or that is to say, a register delay step number D (delay step number n+delay step number m), is stored. This delay step number D can be changed so that the musical tone which is finally generated by the musical tone synthesizing apparatus has tone color which is as close as possible to that of an acoustic musical instrument. This delay step number memory 13 outputs the delay step number D corresponding to a key code KC to a step number ratio memory 14. A ratio of delay step numbers n and m (n:m) corresponding to the key code KC are stored in step number ratio memory mechanism 14; after the delay step number ratio corresponding to the said key code KC has been found, the delay step number D is divided into two parts based on this delay step number ratio and delay step numbers n and m found and outputted to delay circuits 3 and 7. In this way, in this preferred embodiment, by changing the delay step numbers n and m of delay circuits 3 and 7 in correspondence with key codes KC, the differences in striking position resulting from the differences in the keys struck can be simulated. These delay step numbers n and m can, like the delay circuits discussed above, be changed so that the musical tone which is finally generated by the musical tone synthesizing apparatus has tone color which is as close as possible to that of an acoustic musical instrument.

Next, the operation of the preferred embodiment with this construction will be explained.

First, a musical tone generation control circuit which is not shown in the diagram outputs a key code KC and an initial value V0. The key code KC is supplied to delay step number memory 13 and step number ratio memory 14. Furthermore, the initial value V0 is supplied to non-linear function generator 12.

Then, the delay step number memory 13 outputs a register delay step number D corresponding to key code KC to step number ratio memory 14. Next, step number ratio memory 14 outputs delay step numbers n and m, in accordance with key code KC and register delay step number D, to delay circuits 3 and 7. Then delay circuits 3 and 7 establish delay step numbers n and m.

Non-linear function generation mechanism 12 operates in the following manner. First, integrator 28 integrates initial value V0 and supplies a hammer displacement signal y to subtracter 23. In this case, the hammer displacement signal y changes from a negative to a positive value as time elapses. Furthermore, during this period, as string displacement signal x is still 0, difference signal z has a negative value. As a result, reverse force signal F is 0 during this period, as shown in FIG. 4, and the signal beta outputted by integrator 26 is also 0. Accordingly, only initial value V0 is integrated by integrator 28, and hammer displacement signal y changes from a negative to a positive value, as discussed above (see arrow F1 in FIG. 4; this corresponds to the movement of the hammer In the direction of the string S at rest).

Next, when difference signal z exceeds 0 and acquires a positive value (corresponding to the deformation of string S by the hammer), a reverse-force signal F corresponding to a reverse force of a size corresponding to the difference signal z is outputted from ROM 24. This reverse-force signal F is supplied to multipliers 25 and 29 and closed-loop circuit 1.

In multiplier 25, this reverse-force signal F Is multiplied by a coefficient of −1/M, and the acceleration signal a (negative value) thus calculated. Furthermore, this acceleration signal a is integrated by integrator 26, and a signal B thus found which corresponds to the component of the change in velocity. Next, in integrator 28, integration is carried out with respect to the result of the subtraction of the component of signal β alone from the initial value V0, and a new hammer displacement signal y is outputted to subtracter 23.

Furthermore, in adders 4 and 8 of closed-loop circuit 1, the reverse-force signal F is added to the excitation signal of the same loop, and this is circulated around the loop as a new excitation signal. Each excitation signal which has traveled once around the loop is outputted by delay circuits 3 and 7 and fed back to non-linear function generator 12. In addition, the excitation signals circulating around this closed-loop circuit 1 are outputted as musical tone signals through the medium of multiplier 11.

In non-linear function generator 12, the fed-back excitation signals are added in adder 20 and supplied to multiplier 21 as velocity signals VS1. These are multiplied by coefficient K2 at multiplier 21 and supplied to adder **22*a* of integrator 22. Reverse-force signal F, which was multiplied by coefficient K1 in multiplier 29, is also supplied to adder 22*a*; the reverse-force signal F is added to the output signal of multiplier 21 discussed above and is integrated. Next, integrator 22 supplies a new string displacement signal x to subtracter 23. Subtracter 23 subtracts the new string displacement signal x from the new hammer displacement signal y discussed above, and thus calculates the difference signal z. ROM 24** then outputs a new reverse-force signal F in correspondence with the difference signal z.

The above operation is carried out until signal β exceeds the initial value V0. Acceleration signal a and signal β move in the negative direction as difference signal z increases during this period. Accordingly, in the case of an increase in the hammer displacement signal y, they slowly decrease.

Then, when the value of signal β exceeds 0 (corresponding to a reversal In the direction of the velocity of the hammer, to a direction away from string S), hammer displacement signal y changes to a negative direction. When the hammer displacement signal y changes to a negative direction, difference signal z becomes gradually smaller, and as a result, reverse-force signal F gradually becomes smaller (see arrow F2 in FIG. 4). Accordingly, the excitation signal circulating around closed-loop circuit 1 also gradually grows weaker. When the difference signal z becomes smaller than 0 (corresponding to a state in which the hammer is separated from string S and released from the elastic characteristics thereof), the operation above ends.

Furthermore, when a key code KC differing from the above key code KC and an initial value V0 are outputted by the musical tone generation control apparatus, the step number ratio memory 14 supplies delay step numbers n and m corresponding to the newly supplied key code KC to delay circuits 3 and 7. Furthermore, the non-linear function generator 12 supplies a reverse-force signal F corresponding to the new initial value V0 to the closed-loop circuit 1. Then, operations of the same type as those discussed above are carried out In closed-loop circuit 1 and non-linear function generator 12.

In the above manner, in this preferred embodiment, the tone color of musical tones changes slightly in response to a key code KC (pitch).

Figure 5:
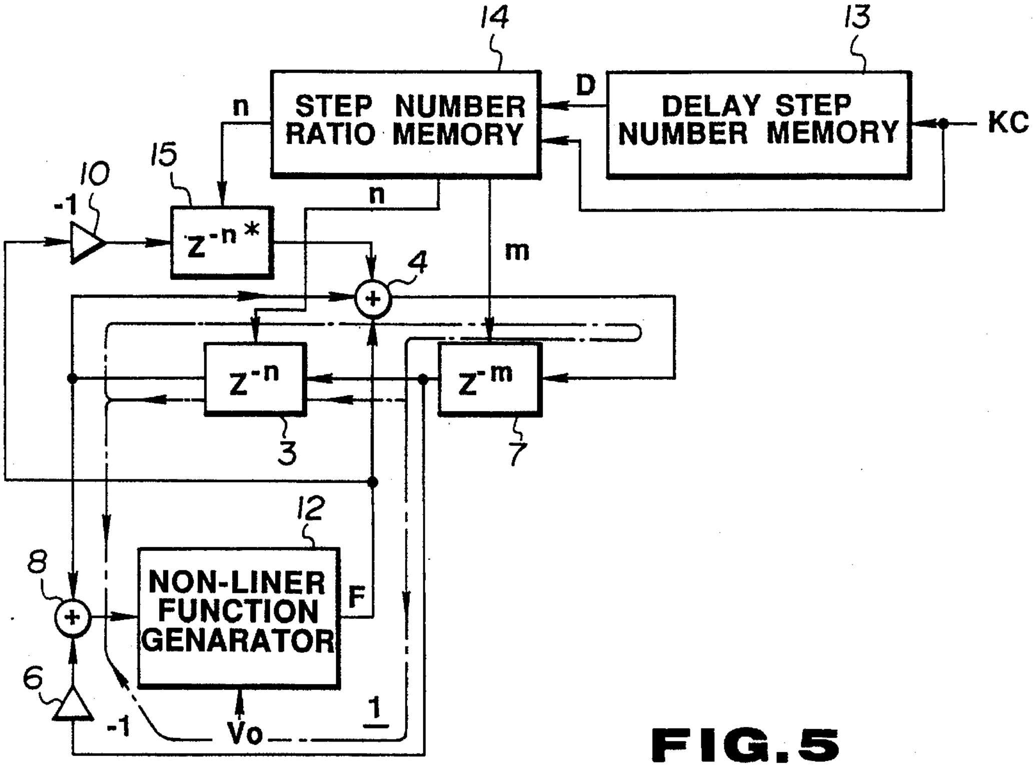
FIGS. 5, 6, 7, and 8 are block diagrams showing constructions of modifications of the same preferred embodiment.

Furthermore, various modifications to the musical tone synthesizing apparatus shown In FIG. 1 are possible. The filter shown in FIG. 1 is excluded from the following explanations. First, FIG. 5 shows a musical tone synthesizing apparatus in which the initial step such as in lower tone strings, from the striking of the string to the return of the vibration reflected at a fixed end, is realized by delay circuit 15. In the diagram, the Inversion circuits 6 and 10 correspond to the fixed ends T1 and T2 shown in FIG. 2. Furthermore, the position HP at which the string is struck is determined by the delay step numbers n and m of delay circuits 3 and 7.

In accordance with the above construction, first, a key code KC is supplied to delay step number memory 13 or step number ratio memory 14, and the initial value V0 is supplied to non-linear function generator 12. Next, the step number ratio memory 14 outputs delay step numbers n and m to delay circuits 3, 15, and 7. Furthermore, non-linear function generator 12 outputs a reverse-force signal F corresponding to the initial value V0. This reverse-force signal F is supplied to adder 4 and inversion circuit 10. The signal supplied to inversion circuit 10 is supplied to delay circuit 15. Furthermore, the output signal of adder 4 is supplied to delay circuit 7, and the output signal of delay circuit 7 is supplied to delay circuit 3 and inversion circuit 6. Furthermore, the output signal of delay circuit 3 is supplied to adders 4 and 8. In adder 8, the output signal of delay circuit 3 and the output signal of inversion circuit 6 are added and fed back to the non-linear function generator 12. Non-linear function generator 12 outputs a new reverse-force signal F corresponding to the fed-back excitation signal to adder 4. In this adder 4, the output signals of delay circuits 3 and 15 discussed above are added to reverse-force signal F, and this is circulated around closed-loop circuit 1 again as a new exaltation signal.

Figure 6:
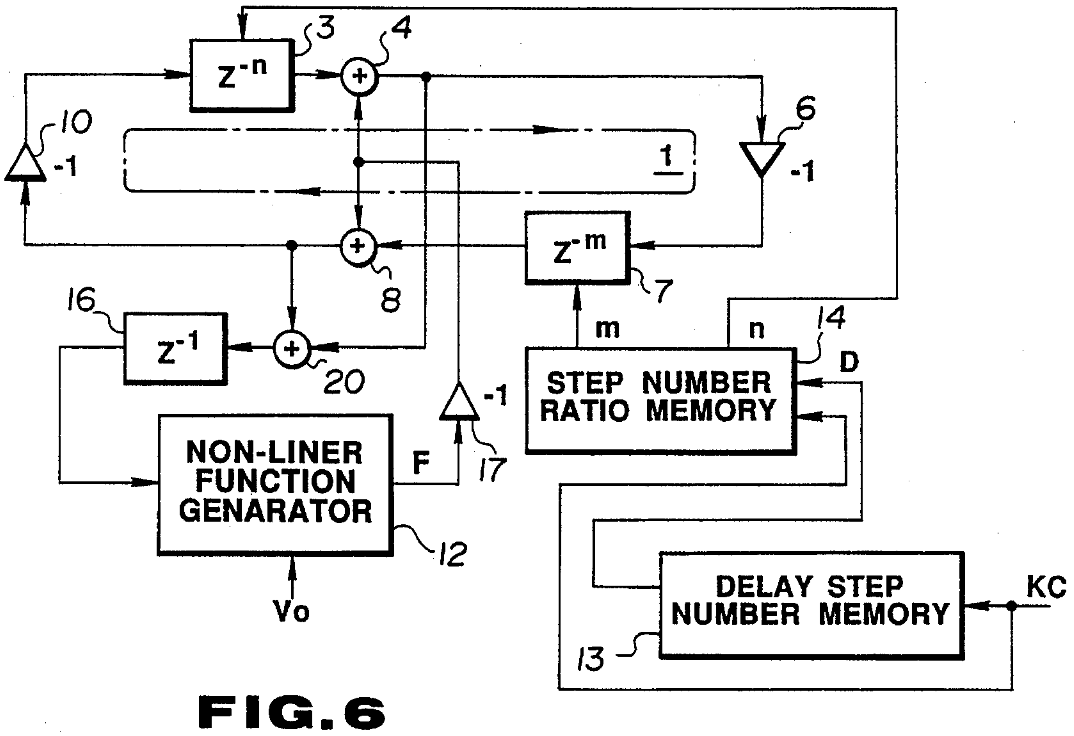

Next, in FIG. 6, after the reverse-force signal F outputted by non-linear function generator 12 has been inverted by temporary inversion circuit 17, this is supplied to adders 4 and 8 of closed-loop circuit 1. Accordingly, in this case, by feeding back the output signals of adders 4 and 8 to non-linear function generator 12, a general balance is achieved. Furthermore, the fed-back excitation signal is added by adder 20, and this is supplied to delay circuit 16. In the diagram, adder 20 and delay circuit 16 are shown as constituent elements separated from non-linear function generator 12, but they can be thought of as parts of nonlinear function generator 12 as well. In this example, the position HP at which the strings are struck is determined by means of delay step numbers n and m of delay circuits 3 and 7. As the operation in the case of the above construction is obvious from the explanation of the operation of the musical tone synthesizing apparatus shown in FIG. 1, such an explanation will be here omitted.

Figure 7:
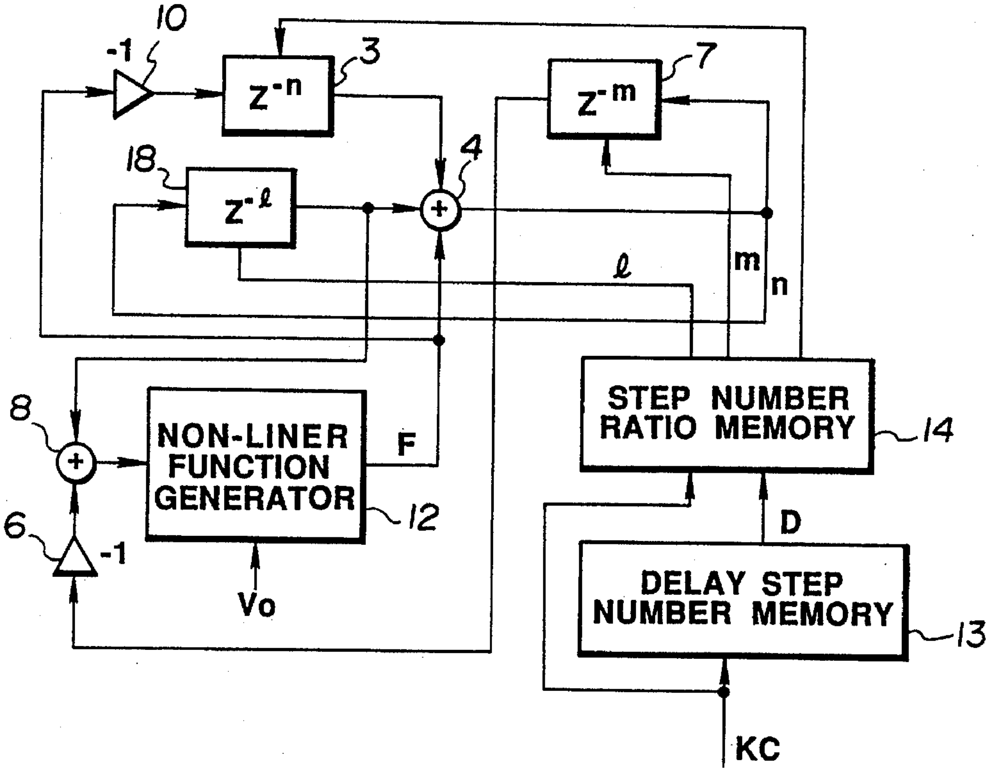

Next, in FIG. 7, an expanded version of the musical tone synthesizing apparatus shown in FIG. 5 is shown; the pitch of the excitation signal circulating around closed-loop circuit 1 is determined by means of delay step number L of delay circuit 18. Furthermore, the position HP at which the strings are struck is determined by delay step numbers n and m of delay circuits 3 and 7. Accordingly, delay step numbers n, m and L corresponding to key codes KC are stored in step number ratio memory 14.

Figure 8:
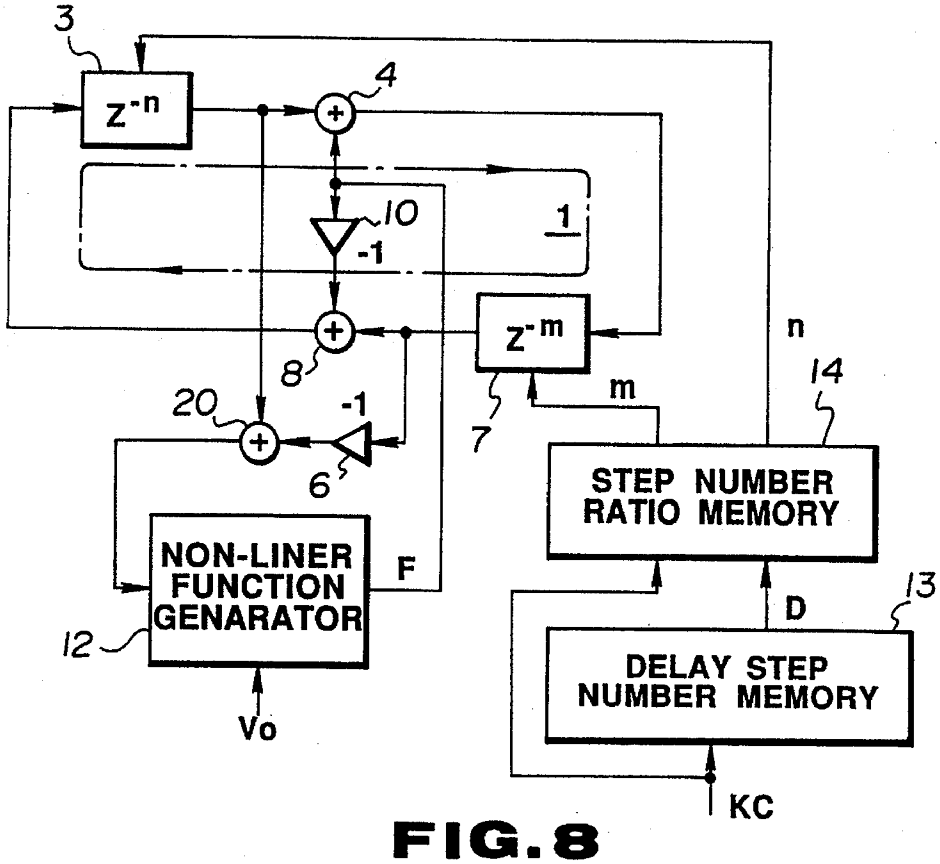

Next, in FIG. 8, a version of the musical tone synthesizing apparatus shown in FIG. 1 In which the position of inversion circuits 6 and 10 is changed is shown. In the case of this example, the position HP at which the strings are struck is determined by delay step numbers n and m of delay circuits 3 and 7.

In the preferred embodiment shown In FIG. 1 and FIGS. 5–8, ROM 24, which stores the non-linear functions A, was used as the element which outputs the reverse-force signal F in correspondence with the difference signal z, but it is acceptable to find reverse-force signal F by calculations based on difference signal z.

Furthermore, In the preferred embodiments above, the case in which the musical tone synthesizing apparatus was realized by means of analog circuits was explained, but the same effects are obtained in the case in which digital circuits are used.

In addition, the delay step number ratio need not be determined by means of a key code (pitch data); it is acceptable to indicate it by means of other manually operable members.

Furthermore, it is acceptable to use the waveguide disclosed in Japanese Patent Application, Laid-open No. Sho. 63-40199, as the closed-loop circuit 1 containing delay circuits discussed above.

As explained above, in accordance with the present invention, since the delay periods of delay circuits in a closed-loop circuit are set in correspondence with pitch data so that they are different, the differences in tone color resulting from the differences in the position at which the strings are struck in an acoustic musical instrument can be reproduced with fidelity.

What is claimed is:

1. A musical tone synthesizing apparatus for synthesizing the musical tones simulating an acoustic musical instrument of the type comprising a vibrating element and an operator for exciting a part of said vibrating element to thereby generate reciprocally propagating vibrations, said operator and vibrating element being determinative of pitch of said musical tone, said musical tone synthesizing apparatus comprising:

operating means, corresponding to said operator, for providing operational data including data indicative of pitch;

a closed-loop circuit comprising at least two delay means each having a variable delay time, the sum of said delay times corresponding to a period of said reciprocally propagating vibration;

excitation means, responsive to the operational data, for generating an excitation signal corresponding to an excitation vibration imparted to said vibrating element and for supplying said excitation signal to said delay means;

delay period memory means for providing a delay period, indicative of said sum of said delay times, of said delay means in correspondence with pitch data of said operational data; and delay time ratio memory means for storing a ratio of said delay times, dividing said delay period into said delay times in accordance with said delay ratio, and supplying said delay times to said delay means.

2. A musical tone synthesizing apparatus in accordance with claim 1, having a first and a second signal inversion means which simulate reflection of said vibration of said vibrating element at both ends, said first and second signal inversion means being disposed in said closed-loop circuit at first and second locations, respectively.

3. A musical tone synthesizing apparatus In accordance with claim 1, further comprising:

a third delay means, which is placed between one of said delay means and said excitation means for generating tones corresponding to an initial vibration which is damped by returning to a position at which said string was struck by a hammer, after being reflected at one fixed end of said string.

4. A musical tone synthesizing apparatus in accordance with claim 1, in which said excitation means supply said excitation signal to said delay means, after said excitation signal has been inverted.

5. A musical tone synthesizing apparatus in accordance with claim 3, in which said third delay means has a delay time which is equal to one of the delay time of said delay means.

6. A musical tone synthesizing apparatus in accordance with claim 2, in which said first signal inversion means is placed between an output terminal of said excitation means and an input terminal of one of said delay means, and said second signal inversion means is placed between an input terminal of said excitation means and an output terminal of another of said delay means.

7. A musical tone synthesizing apparatus in accordance with claim 1, in which each of said at least two delay means includes an input terminal and an output terminal, said excitation means has memory means which stores said excitation signal corresponding to said excitation vibration imparted to said vibrating element, reads out said excitation signal in accordance with said operational data of said operating means, and supplies said excitation signal to respective input terminals of two of said delay means in said closed-loop circuit.

8. A musical tone synthesizing apparatus in accordance with claim 1, in which said closed-loop circuit, said excitation means, said delay period memory means, and said delay period ratio memory means comprise digital circuits.

9. A musical tone synthesizing apparatus in accordance with claim 1, in which said closed-loop circuit, said excitation means, said delay period memory means, and said delay period ratio memory means comprise analog circuits.

10. A musical tone synthesizing apparatus for synthesizing the musical tones comprising;

pitch designating means for designating pitch of a musical tone to be synthesized;

a closed-loop circuit comprising at least two delay means each having a variable delay time, the sum of said delay times corresponding to the pitch designated by said pitch designating means;

excitation means for generating an excitation signal and for supplying said excitation signal to said delay means; and control means for controlling the ratio of said variable delay times of said at least two delay means in accordance with the designated pitch.

11. A musical tone synthesizing apparatus according to claim 10 further comprising:

memory means for storing the delay time ratios of said variable delay times in accordance with the pitch of the musical tone.

* * * * *